United States Patent
Black et al.

(10) Patent No.: US 6,343,032 B1
(45) Date of Patent: Jan. 29, 2002

(54) NON-VOLATILE SPIN DEPENDENT TUNNEL JUNCTION CIRCUIT

(75) Inventors: William C. Black; Bodhisattva Das, both of Ames, IA (US); Marwan M. Hassoun, Austin, TX (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 09/610,503

(22) Filed: Jul. 6, 2000

Related U.S. Application Data

(60) Provisional application No. 60/144,408, filed on Jul. 7, 1999.

(51) Int. Cl.[7] .............................................. G11C 11/00
(52) U.S. Cl. ..................... 365/158; 365/50; 365/171; 365/173; 365/157
(58) Field of Search ........................... 365/158, 50, 171, 365/173, 57, 55, 225.5, 49

(56) References Cited

U.S. PATENT DOCUMENTS

| | | |
|---|---|---|
| 4,731,757 A | 3/1988 | Daughton et al. |
| 4,751,677 A | 6/1988 | Daughton et al. |
| 4,754,431 A | 6/1988 | Jenson |
| 4,780,848 A | 10/1988 | Daughton et al. |
| 4,829,476 A | 5/1989 | Dupuis et al. |
| 4,857,418 A | 8/1989 | Schuetz |
| 4,897,288 A | 1/1990 | Jenson |
| 4,918,655 A | 4/1990 | Daughton |
| 4,945,397 A | 7/1990 | Schuetz |
| 4,953,002 A | 8/1990 | Nelson et al. |
| 5,012,444 A | 4/1991 | Hurst, Jr. et al. |
| 5,019,461 A | 5/1991 | Schuetz |
| 5,060,193 A | 10/1991 | Daughton et al. |
| 5,064,499 A | 11/1991 | Fryer |
| 5,349,302 A | 9/1994 | Cooper |
| 5,496,759 A | 3/1996 | Yue et al. |
| 5,569,617 A | 10/1996 | Yeh et al. |
| 5,756,366 A | 5/1998 | Berg et al. |
| 5,838,608 A | * 11/1998 | Zhu et al. .................. 365/158 |

(List continued on next page.)

OTHER PUBLICATIONS

Prinz, Gary A., "Magnetoelectronics", Science, vol. 282, Nov. 27, 1998 issue, "Science's Compass" review section (4 pages).

"Spin Dependent Tunnel Junctions; Clemens Group Spin Dependent Tunneling Project"; 1 page abstract referring to Bobo, J. et al. "Spin Dependent Tunneling . . . " J. Appl. Phys. 83, 6685, downloaded from http://www-mse.stanford.edu/faculty/clemens/tunnelproj.http; Jul. 7, 1999.

(List continued on next page.)

* cited by examiner

Primary Examiner—David Nelms
Assistant Examiner—David Lam
(74) Attorney, Agent, or Firm—Zarley, McKee, Thomte, Voorhees & Sease

(57) ABSTRACT

A device and method for sensing the status of a non-volatile magnetic latch. A cross-coupled inverter pair latch cell is employed for the data sensing. During the 'Sense' cycles, the inputs to the latch cell are from spin dependent tunneling effect devices, each located in its respective inverter pair. The SDT magneto-resistive storage devices have complimentary resistance states written into them. A switch, connected to the inverter pairs, is used to reset and initiate a regenerative sequence. Whenever the switch is turned on (reset) and off (regenerate), the latch cell will sense a potential imbalance generated by the magneto-resistive storage devices with complimentary resistance. During regeneration, the imbalance will be amplified and eventually the inverter pairs will reach a logic high or logic low state. The latch can be used as a memory circuit, however, upon loss of power the memory is retained. The state of the circuit is retained inside of SDT components. On-chip current lines are used to control the states of the components.

66 Claims, 5 Drawing Sheets

U.S. PATENT DOCUMENTS

| | | |
|---|---|---|
| 5,939,772 A | 8/1999 | Hurst et al. |
| 5,956,267 A | 9/1999 | Hurst et al. |
| 5,982,658 A | 11/1999 | Berg et al. |
| 6,021,065 A * | 2/2000 | Daughton et al. .......... 365/158 |
| 6,027,948 A | 2/2000 | Jensen et al. |
| 6,048,739 A | 4/2000 | Hurst et al. |
| 6,128,214 A | 10/2000 | Kuekes et al. |
| 6,147,900 A | 11/2000 | Pohm |
| 6,147,922 A | 11/2000 | Hurst et al. |
| 6,175,525 B1 | 1/2001 | Fulkerson et al. |
| 6,178,111 B1 | 1/2001 | Sather et al. |

OTHER PUBLICATIONS

Bobo, J., Mancoff, F.B., Bessho, K., Sharma, M., Sin, K. Guarisco, D. Wang, S.X., Clemens, B.M.; "Spin Dependent Tunneling Junctions with Hard Magnetic Layer Pinning", J. Appl. Phys. 83, 6685–6687 (1998), American Institute of Physics.

Textbook entitled "MOS Digital Circuits", § 13.7 entitled "Latches and Flip Flops", pp. 944–947 (published prior to filing date of present application).

Textbook chapter 8 entitled "Regenerative Circuits", pp. 452–455 (published prior to filing date of present application).

Tehrani et al. "High Density nonvolatile Magnetoresistive RAM", Motorola In., phoenix Research Laboratories, pp. 7.7.1–7.7.4, IEEE 1996.

NON-VOLATILE SPIN DEPENDENT TUNNEL JUNCTION CIRCUIT

THIS APPLICATION IS BASED ON APPLICANTS' PROVISIONAL APPLICATION SERIAL NUMBER 60/144,408, FILED JUL. 7, 1999

BACKGROUND OF THE INVENTION

1. Field of the Invention

The present invention relates to non-volatile magnetic circuits, and in particular, to non-volatile memory, including latches.

2. Problems in the Art

A significant problem with RAM (random access memory) is that the memory is lost upon loss of power. This is contrary to ROM (read only memory) where data is typically stored during manufacturing and is non-volatile. Random access memory is utilized by a computer for fast storage of in-use programs or data.

Non-volatile memory, besides magnetic disks and tapes, is not new in the art. Computer core memory itself was non-volatile before the introduction of semi-conductor RAM in the early 1970's. It was assembled from magnetic cores, which were fabricated out of magnetic ferrite materials. These transformer coils were tiny toroidal rings, which were threaded with fine copper wires. Current pulses through the wires would magnetize the cores either at a right or left handed direction to store a 0 or a 1; and thus have a bipolar or binary memory element. Each core was a bit. However, this memory was slow and expensive and was low density by today's standards.

In comparison, present semi-conductor RAM is relatively fast, relatively cheap to fabricate in large quantities, and relatively small in size. However, it is volatile. Similarly, most semi-conductor digital components, such as latches, counters, flip-flops, etc. have the above-mentioned advantages, yet are also volatile. There is a need for non-volatile components of this type. Regardless of non-volatility, there is room in the art with respect to RAM or other digital logic components that are further reduced in size, speedier, more reliable, and can be operated by and consume less power.

Attempts have been made to return to the utilization of magnetism (non-volatile) as a method of storing binary information. An example of a magneto-resistive storage device is experimentation with anisotropic magnetoresistance (AMR) using one or more layers of AMR magnetic film. Localized portions of the material are magnetized in different directions to store the binary information.

Another example is the Giant Magneto-Resistive (GMR) effect. It results in larger changes in resistance in response to small magnetic fields in certain layered materials than are typically observed with the AMR effect. The GMR effect and a general explanation thereof are discussed in Prinz, Gary A., "Magnetoelectronics," incorporated by reference herein. Depending on the magnetism relative to spin polarization of current, the GMR material can be more or less conductive for electrons of specific spin polarization.

It has been shown that the magnetic field generated by even small currents could thus "program" a GMR component to several "logic states", i.e. higher resistance or lower resistance. Thus, it is possible to "sense" the logic state by sending current through the programmed GMR component and deriving its resistance (i.e. whether it is the higher or lower resistance). This produces a bipolar memory element that has the advantages of low power read or write, non-volatility, and self-containment. Also, importantly, there are no limitations to the number of read/write cycles known and both reading and writing can be done at high speeds; higher than most existing non-volatile latches or memory elements.

Spin-polarized tunneling or spin dependant tunneling (SDT) is discussed at Bobo, J. F., et al., "Spin Dependent Tunneling Junctions with hard magnetic layer pinning", J. App. Phys. 83, 6685 (1998), which is herein incorporated by reference. In memory applications, SDT devices may be preferable to GMR devices in that they typically have a larger signal and higher intrinsic resistance for small area components.

However, the mere fact that SDT magneto-resistive storage devices have been pointed out as possible memory elements is not sufficient for effective implementation and operation in an actual circuit, where not only must data be stored in the device but also efficiently retrieved with a minimum of sensing circuitry. To perform adequately, the memory element must not only be programmable or writeable to at least two states, the different states must be reliably readable by the system. Further, it is important that the memory element be able to reliably withstand multiple, and preferably unlimited, read and/or write cycles.

There have been some attempts to create non-volatile, solid state latches or memory elements that improve over the state of the art. Many of such components require significant write energy. They have limitations regarding read/write speed and number of read/write cycles.

One specific example is called NOVRAM (from Xicor). It is relatively large in size and therefore is less conducive to large scale RAM and the like. It requires an off-chip component. It is also relatively slow.

It is therefore a primary object of the present invention to improve over the problems and deficiencies in the art.

Another object of the present invention is to provide random access memory that can maintain a state or store data without power, and is non-volatile.

Further objects, features, and advantages of the present invention include an apparatus and method for a non-volatile magnetic latch, which has:

a) low write energy and low program/reprogram energy;
  b) higher read/write speed;
  c) an unlimited number of read/write cycles;
  d) the entire latch function included on-chip, and therefore no off-chip components are needed; and
  e) small signal analysis to predict state of latch.

These and other objects, features, and advantages of the invention will become more apparent with further reference to the specification.

SUMMARY OF THE INVENTION

The invention is a non-volatile latch with magnetic based data storage that can be programmed using an on-chip current generated magnetic field. The latch relies on SDT component, as the fundamental data storage unit.

Resistance of the SDT component can be programmed to higher or lower values, for example, with an on-chip current generated field. This higher or lower resistance can then be sensed by a regenerative sequence, which senses an electrical potential imbalance, in one example, generated by SDT magneto-resistive storage devices with complimentary resistance. During regeneration, such an imbalance can be amplified and the latch will reach a logic high or logic low state.

BRIEF DESCRIPTION OF THE DETAILED DRAWINGS

Figure 1:
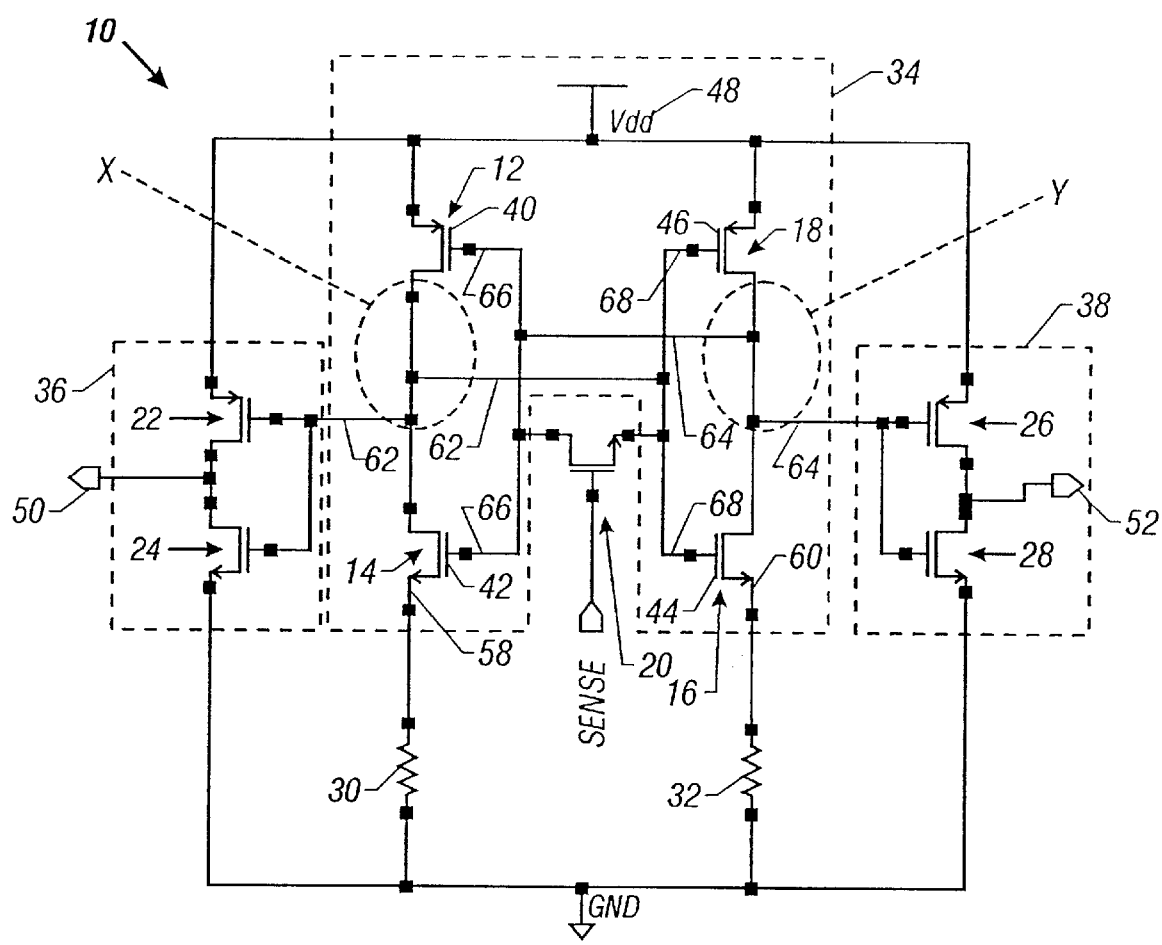
FIG. 1 is a schematic view of a preferred embodiment of a non-volatile magnetic latch cell according to the present invention with optional buffer output inverters.
Figure 3A:
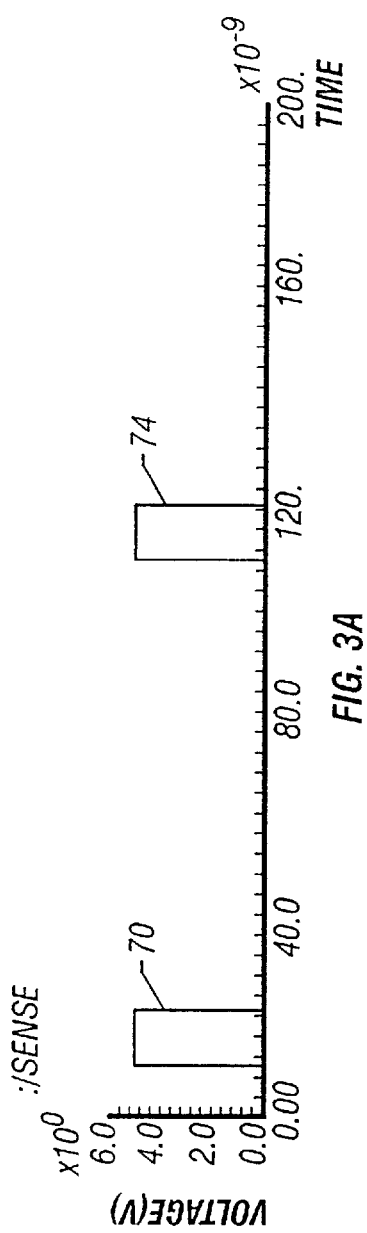
Figure 3B:
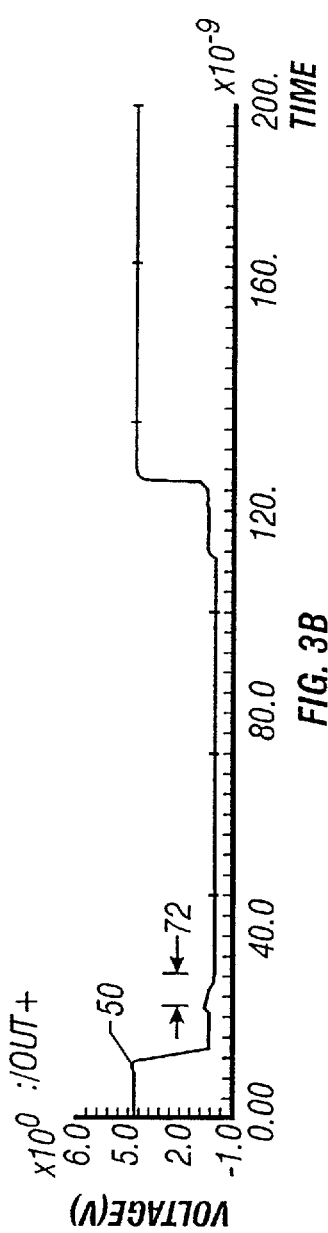
Figure 3C:
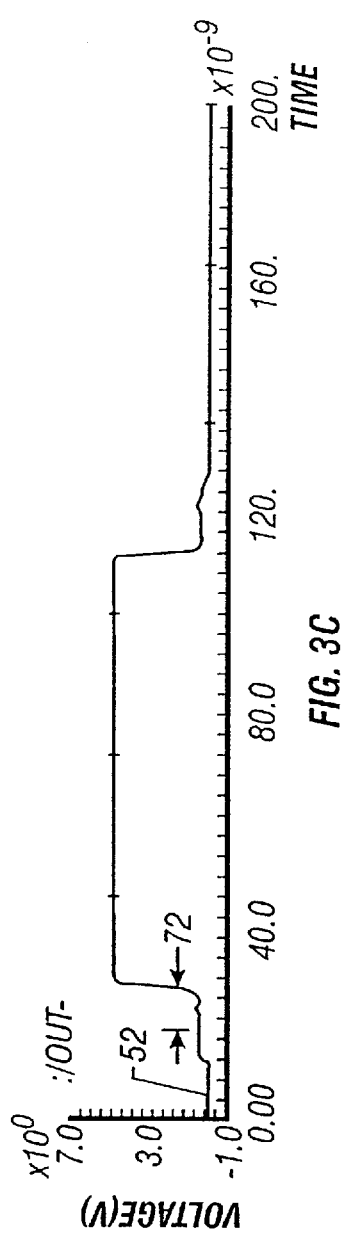

FIGS. 3A–C are graphical plots of the operation of the circuit in FIG. 1.

Figure 4B:
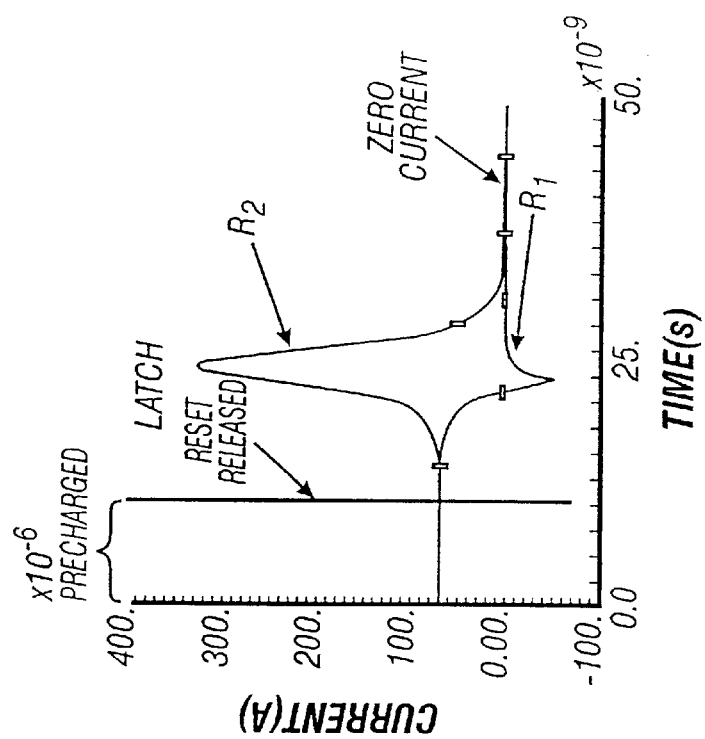
Figure 4A:
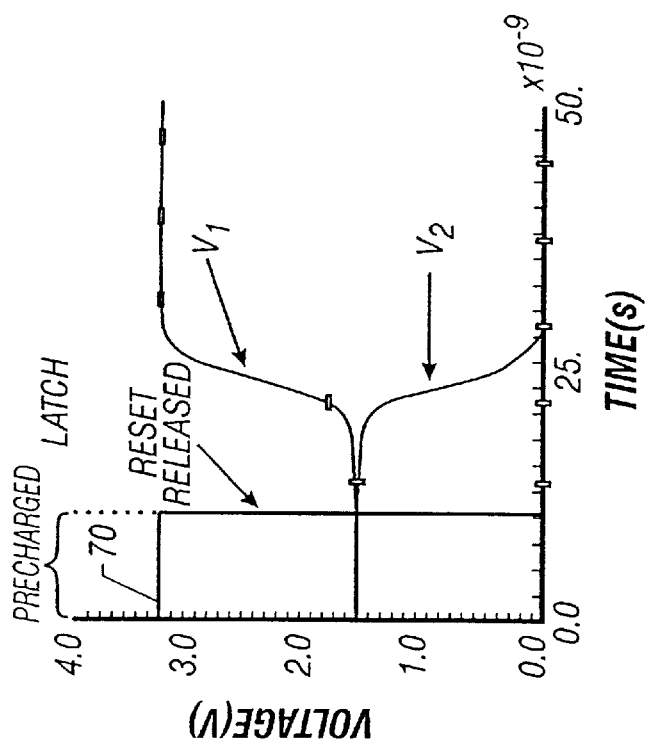

FIGS. 4A and 4B are additional graphical plots of the operation of the circuit in FIG. 1.

Figure 2:
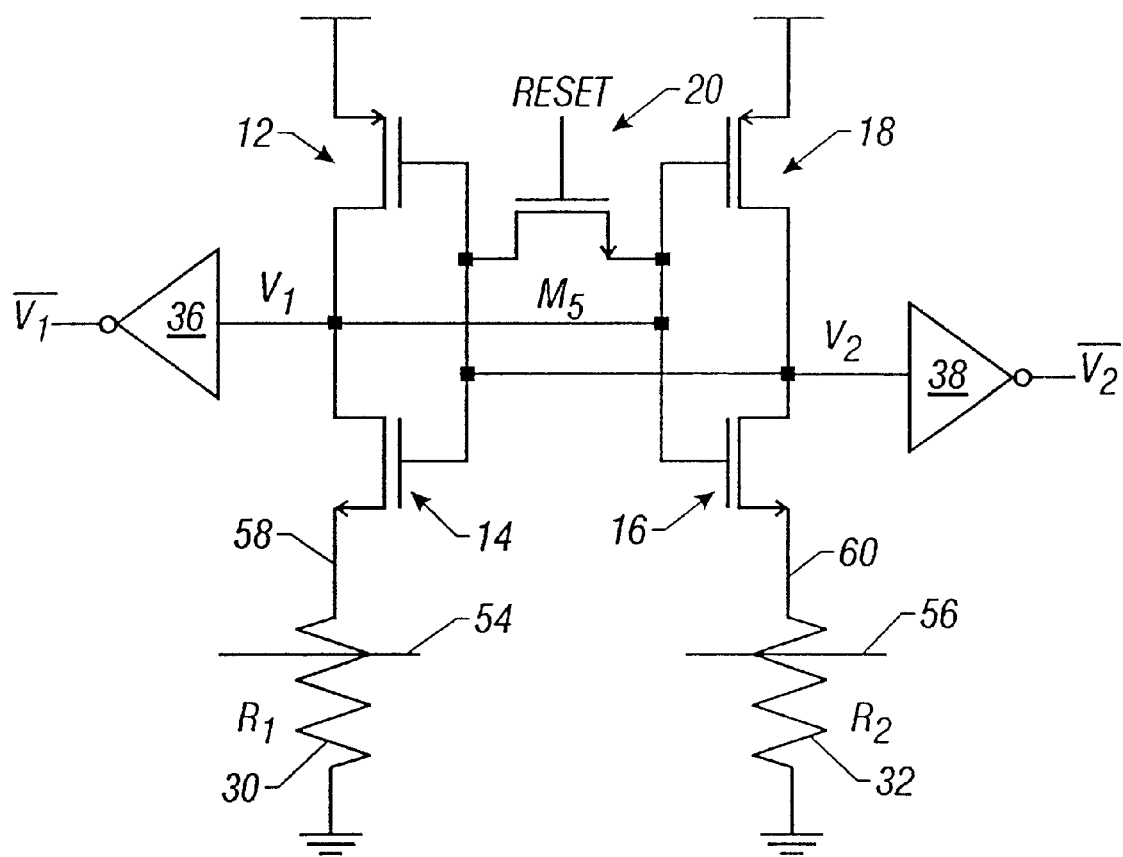
FIG. 2 is a schematic view of a non-volatile magnetic latch cell with "write lines" located adjacent to the magneto-resistive storage devices.
Figure 5:
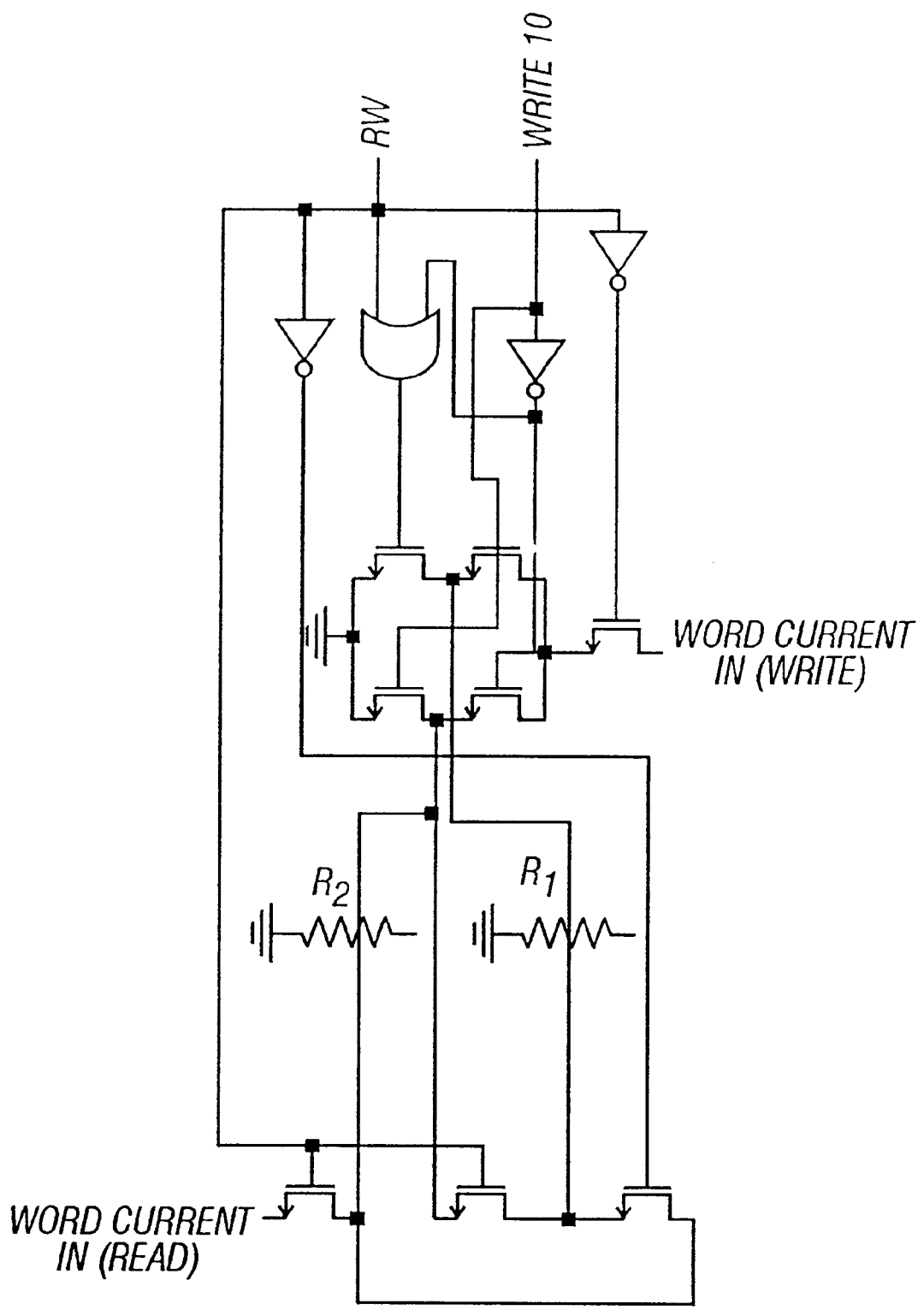

FIG. 5 is an example of a word line control circuit for the "write lines" such as shown in FIG. 2.

DETAILED DESCRIPTION OF THE PREFERRED EMBODIMENT

To assist in a better understanding of the invention, a preferred embodiment of the invention will now be described in detail. It is to be understood that this is but one form the invention can take and is for purposes of illustration and not limitation.

To assist in this description, reference will frequently be taken to the detailed drawings.

Overview

As previously discussed, spin dependent tunneling (SDT) has shown that there can be meaningful changes in resistance in response to small magnetic fields in thin film layered composites of certain configurations. The mechanism of SDT is discussed in Bobo, J. F., et al., supra, and is known in the art. Depending on the magnetic moments of the individual magnetic layers, the film may be more or less conductive.

Environment

The preferred embodiment of the present invention will be discussed as implemented as a standard latch or as a standard random access memory chip (and sometimes referred to as MRAM). However, this circuit can be used as or in combination with other things, including but not limited to such things as counters, comparators, and similar logic components.

Structure of the Preferred Embodiment

By referring to FIG. 1, an exemplary circuit for a non-volatile magnetic latch 10 according to a preferred embodiment of the invention is illustrated. It is to be understood that elements 12, 14, 16, 18, 20, 22, 24, 26, and 28 represent CMOS type transistors. It should be noted, however, that the invention is not limited to CMOS type transistors. Elements 30 and 32 are SDT devices having the capabilities discussed above.

Transistors 12, 14, 16, and 18, and their interconnections, represent a traditional cross-coupled inverter pair CMOS latch cell 34, which is employed as a part of data sensing. Elements 22/24 and 26/28 represent inverters 36 and 38 that buffer the latch cell 34 from other circuitry and in many cases are unnecessary. Inverters 36 and 38 also function to take the incoming state from either output 62 or 64 of latch cell 34 and invert it (example: incoming state is a 1, outgoing state is a 0).

Transistor 20 is located between the gates 40/42 and 44/46 of the cross-coupled inverter pairs that make up the standard latch 34. Transistor 20 essentially represents a switch used to reset and initiate a regenerative sequence. This is the data sensing sequence.

SDT devices 30 and 32 are the SDT components and play the role of the fundamental non-volatile storage unit of the circuit. They also provide a differential input source to the latch 34. The particular magneto-resistive storage devices 30 and 32 used in this implementation of the latch 10 each are spin dependent tunnel junctions consisting of two ferromagnetic films separated by a thin electrically insulating layer. Electrical current flows through the junction perpendicular to the layers by tunneling from one ferromagnet to the other through the insulator. This is in contrast to the multilayer GMR device where the current flows parallel to the layers of the structure.

Circuit 10 is powered by Vdd 48 (5VDC) and has two outputs, 50 and 52.

The resistance of SDT magneto-resistive storage devices 30 and 32 can be programmed to a high/low resistance state with an on-chip current generated magnetic field. As shown in FIG. 2, such can be accomplished by running lines 54 and 56 above (or below) and across SDT magneto-resistive storage devices 30 and 32. Another possible approach would be to use multiple word lines that together supply sufficient magnetic field to switch the bits (coincident addressing scheme). This could be used, for example, in an SRAM arrangement. Current through such lines 54 and 56 will generate a magnetic field which can be used to "program" or "write to" the SDT magneto-resistive storage devices 30 and 32. SDT magneto-resistive storage devices 30 and 32 are connected to the sources 58 and 60 of the N-channel MOS transistors 14 and 16 and act as the inputs to latch cell 34.

As is discussed in more detail herein, switching transistor 20 is located between the gates 42/40 and 44/46 of the two cross-coupled inverters of latch cell 34 and is used to reset and initiate the sense cycle.

With reference to FIG. 1, the outputs 62 and 64 of the cross-coupled inverter pairs of latch cell 34 are sent to each inverter 36 and 38 respectively, where the input state to the inverters 36 and 38 is inverted. Switch 20 is an N-channel MOS type transistor, although in other embodiments it could be a PMOS transistor or a transmission gate. The outputs 62 and 64 of each cross-coupled inverter pair of latch cell 34 are sent to the inputs 66 and 68 of the other. This circuit is commonly referred to as a bi-stable circuit having two complimentary outputs 62 and 64. Typically, the state of outputs 62 and 64 depends on an external excitation that can force outputs 62 and 64 to a particular state. However, as in the present case shown in FIG. 1, the state can change upon magnetic information sensed by turning on and off transistor 20. Latch 10 then memorizes this external action by staying indefinitely in the acquired state. Thus, latch 10 can function as a simple memory circuit (as, for example, in a six-transistor SRAM cell), but with a magnetic "shadow" memory that can be read at any time.

An SDT component works on the principal of spin dependent tunneling explained at Bobo, et al., supra, which may be used for magnetic storage of information. SDT is a quantum mechanical effect, which occurs by sandwiching thin film layers of ferromagnetic material separated by a thin insulating layer, which acts as a tunnel barrier. When the magnetic moments of the ferromagnetic layers are parallel, the spin dependence tunneling of the carriers is maximized, and the insulating layer material has its lowest resistance. When the ferromagnetic layers are antialigned, the spin dependence tunneling of the carriers is minimized, and the material has its highest resistance. The directions of the magnetic moments are manipulated by external magnetic fields that are applied to the materials. The manipulating of these magnetic fields can result in significant changes in the tunneling current through the insulator, which appears as a change in effective resistance.

Operation

The following is a detailed discussion of the operation of non-volatile magnetic latch 10.

As shown in FIG. 2, electrical lines or "write lines" 54 and 56 pass over the SDT components R1 and R2 30 and 32. By appropriate control of the current through the write lines 54 and 56 (including magnitude and direction of current flow), the resistance in R1 and R2 can be affected. For example, R1 can be programmed to a higher resistance than R2, or vise versa. The present invention can have all wiring done on-chip. The programming of the SDT components 30 and 32 actually equates to the storing of information inside the latch cell 10. Once the complimentary resistance states are written into the magneto-resistive storage devices 30 and 32, the latch cell 10 is now prepared for the sense cycle.

A simulation example of operation of the latch 10 of FIG. 1 is set forth in FIGS. 3A–C. What will be called condition 1 of the latch cell involves magneto-resistive storage device 30 to be programmed to a higher resistance than magneto-resistive storage device 32. This offset in resistance for SDT magneto-resistive storage devices 30 and 32, although relatively small in magnitude, is the basis for storage of non-volatile binary information. The offset in resistances generates a differential input signal that corresponds to the data written in the resistor pair 30/32. This differential signal not only doubles the signal level, but also common mode rejection of the circuit is enhanced, resulting in less sensitivity to power supply noise and thermal drift of the SDT devices. Herein, it is assumed that one of the SDT devices always has a higher resistance than the other SDT device.

An interfacing circuit is needed to derive retained data from the SDT devices and translate the data representation from resistance form to full logic (voltage) form. The differential resistance is first translated into differential current or voltage signals before the full logic level. A high speed differential current mode or voltage mode amplifier is used to function as the sense amplifier. FIG. 3A illustrates first and second 5 VDC "sense" or "reset" pulses 70 and 74 spaced in time approximately 100 nsec apart. FIGS. 3B and 3C illustrate outputs 50 and 52 of latch 10 over the same time period as in FIG. 3A, and relative to the two sense pulses 70 and 74 of FIG. 3A. Transistors 12, 14, 16, and 18, representing the traditional cross-coupled inverter pair CMOS latch cell 34, essentially create what will be called a regenerator circuit that is sensitive to any circuit imbalance. Without any input to force the circuit to an alternate state from which it is in, the latch 10 will stay at a particular state indefinitely. The SDT magneto-resistive storage devices 30 and 32, can act as that input when switch 20 is sequentially turned on and then off. Because the SDT magneto-resistive storage devices 30 and 32 have complimentary resistance states; meaning that one has a higher resistance than the other; they have made the latch circuit 10 imbalanced. When the switch 20, between the gates 40, 42, 44, and 46 of the two cross-coupled inverters 34, is used to reset and initiate the regenerate sequence, the inputs to the latch cell 10 will be from the SDT magneto-resistive storage devices at the sources 58 and 60 of the two N-channel MOS transistors 14 and 16.

Cross-coupled inverter pair latch cell 34 functions as the sense amplifier and as a static latch cell to electrically retain the data retrieved from the differential SDT components 30 and 32.

As shown in the plots of FIGS. 3A–C, outputs 50 and 52 of the latch cell 10 are initially high and low respectively. When the switch 20 is turned on (sense pulse 70 of FIG. 3A is activated or "reset") and then off (sense pulse 70 is deactivated or "regenerated"), the latch cell 10 will sense the potential imbalance generated by the two SDT magneto-resistive storage devices 30 and 32 with different resistances. When the reset switch is turned on, the outputs of the two cross-coupled inverters go to approximately the same voltage. This is technically a disallowed state somewhere between logic zero and logic one. The two output nodes of latch 10 are essentially shorted together when switch 20 is turned on. This stage of operation of latch 10 can alternatively be called a "precharge" stage. Electrical current tries to pass through both SDT magneto-resistive storage devices 30 and 32 during the sense pulse 70, however, because of the imbalance, current will seek out the path of least resistance (i.e. through SDT magneto-resistive storage device 32). In other words, due to the resistance mismatch, the currents discharging through the two output nodes of latch 10 are different; the current flowing in the lower resistance SDT device is larger than the higher resistance SDT device, and there is a smaller current flowing from the output node at the higher resistance side to the output node of the lower resistance side to compensate for this current imbalance.

When the sense pulse 70 goes low (shutting off switch 20) the regeneration sequence begins. At this time, the loop-gain is greater than positive one meaning that the imbalance will now increase with time indefinitely as compared to the previous case where the imbalance was a steady state. In one inverter 36 or 38, the charging current from the P-channel transistor 12 or 18 is actually smaller than the current sunk by the corresponding N-channel transistor 14 or 16 and therefore, that output node is discharged by the excessive pull-down current. The charging current in the other inverter 36 or 38 is larger than the discharging current and its output node is charged to a higher potential, which, because of the imbalance, triggers the positive-feedback amplifying and initiates the regeneration process.

It is during this sequence when the latch cell 10 will sense the imbalance generated by the SDT magneto-resistive storage devices 30 and 32. During the regeneration, the imbalance between the SDT magneto-resistive storage devices 30 and 32 will effectively be amplified (after a short settling period 72 when the imbalance is being sensed) and latch 10 will eventually reach a logic high or logic low state.

As also shown in the plots of FIGS. 3A–C, once the "sense" pulse 70 is terminated, a "latch phase" occurs, where current through the latch circuit 10 will have sought a path through SDT magneto-resistive storage device 32. At that point, transistor 14 will turn off, disallowing any current flow through SDT magneto-resistive storage device 30. The voltage level at the input to inverter 38 will be low, and thus output 52 will be high, whereas the voltage level at inverter 36 will be high and output 50 will be low. Cross-coupled inverter pair latch cell 34 is essentially a high-gain positive-feedback amplifier where the potential difference across the output nodes rises rapidly, the nodes saturate and settle at full logic potential difference; at which time latch 34 functions as regular static RAM cell with no static power consumption.

Note that in this simulation, the sense pulse 70 is approximately 10 nanoseconds (nsec) in duration, and the output settling time (after the trailing edge of the sense pulse 70) is on the order of 8 nsec. The latch cell 10 thus has a first condition or first logic state (here considered its "logic low state" —i.e. output 50 is low or 0 volts, while output 52 is high or 5 volts) when latch 10 is "read" by sense pulse 70.

To change the state of the latch cell 10, one merely needs to change the states of the SDT magneto-resistive storage devices 30 and 32 and initiate another sense pulse (e.g. see 74 in FIG. 3A). As indicated in FIGS. 3A–C, if the resistances of magneto-resistive storage devices 30 and 32 were reversed (programmed oppositely to a "condition 2", where resistor 30 low and resistor 32 is high), and a sense pulse 74 applied to the latch circuit 10 (see the second or right-most sense pulse in FIG. 3A), the latch cell 10 would change its logic state from "Logic Low State" described above, to "Logic High State" (i.e. output 50 is high or 5 V, and output 52 is low or 0 V).

Note how both outputs 50/52 again go or drop "low" during sense pulse 74, there is a short settling time, and then output 50 goes "high" and output 52 goes "low". Thus, by controlling the magnitude and direction of current through the write lines 54 and 56 associated with SDT magneto-resistive storage devices 30 and 32, the resistance offset in SDT magneto-resistive storage devices 30 and 32 can be manipulated to switch the logic state of the latch cell 10.

This latch circuit 10 saves state with power or without power. With power, the latch circuit 10 merely acts as the standard random access memory that is prominent in today's art. However, if power were lost the SDT magneto-resistive storage devices 30 and 32 would hold their state via the magnetism of the components. Therefore, if power is lost and then regained, upon power up, the latch cell 10 can have the state it had before the last read cycle and before the loss of power. This latch circuit 10, therefore, can be used to create random access memory, which is not subject to loss of memory due to power outages or accidental loss of power. There may be exceptions in which the last state of the latch cell will not be regained upon power up. One example is if the latch was forced into another state by other means (as in SRAM). Another example is if the SDT magneto-resistive components are actually changed in state after the last read cycle or while power is off to the latch.

On "power-up" of the latch cell 10 or at periodic "refresh", "Sense" is held high briefly and then released. Here the latch circuit 10 is simply a means of reading the magnetic bits and writing to the latch happens only via magnetic means.

The simple latch circuit 10 of FIG. 1, minus the output inverters 36 and 38, can be used as a conventional five or six transistor RAM cell whereby outputs 62 and 64 are forced through additional transistors to either a high or low state. This state may be read by turning on these same access transistors. In this arrangement, the memory storage is volatile, like most static RAM. However, by inclusion of the sensing mechanism 20 and the SDT magneto-resistive storage devices in two legs of the latch, such an SRAM cell can quickly assume the state programmed by the magnetic orientation of the SDT magneto-resistive storage devices. In this embodiment, the latch may be written with non-magnetic means. In this latter case, the contents of the latch is not necessarily the content of the magnetic bits if alternate non-magnetic CMOS latch-setting schemes have been employed (such as using it as a six transistor SRAM cell). This is sometimes known as a shadow memory and would allow a device, for example, to "boot-up" based upon the values stored in the magnetic memory while subsequently operating on the values written in the conventional CMOS fashion.

FIGS. 4A and 4B are similar to FIGS. 3A–C, showing simulation of the output voltage (FIG. 4A) and pull-down current (FIG. 4B) of a circuit such as FIG. 1 (but the circuit is for low power applications; and operates on 3.3 VDC rather than 5 VDC). FIG. 4A shows the circuit transient response to the case where $R_1$ (resistance of one SDT device 30 or 32) is greater than $R_2$ (resistance of the other SDT device 30 or 32), whereas FIG. 4B illustrates the current flow in the two SDT resistors during the two phases (precharge and latch) of operation. FIG. 4B provides an approximation of power consumption of the circuit in the different phases of operation.

Options and Alternatives

As previously mentioned, the invention can take many forms and embodiments. The included preferred embodiment is given by way of example only, and not by way of limitation to the invention. Variations obvious to one skilled in the art will be included within the invention.

Some examples of options, variations, and alternatives are given below by way of illustration and not limitation.

The concept of using a sensing switch for a non-volatile magnetic latch 10 can be implemented in a variety of components. Some examples are EEPROM, RAM, portable memory card, shadow memory, and flash memory.

Fabrication of the latch cell 10 or other embodiments according to the invention can be made according to known semi-conductor fabrication and chip procedures.

As is known in the art, one must take into account a variety of things when designing a circuit of this type, including errors in resistance, resistance matching, transistor matching and area, current levels and other relevant parameters. For example, design parameters for latch 10 involve selecting appropriate values for N-channel transistors 14 and 16, P-channel transistors 12 and 18, the N-channel reset transistor 20, and SDT resistors 30 and 32, in addition to taking into account the precharge DC operating points. To obtain best performance of the latch cell, the MOSFET parameters in the sensing amplifier should be matched closely. Thus, transistors 14 and 16 should be matched and transistors 12 and 18 should be matched. In addition, the SDT resistor pair 30 and 32, should also be closely matched. The width to length (W/L) size of transistor 20, the reset transistor, is selected according to the following rules. The minimum W/L ratio of switch 20 is set by the minimum size required to make the loop gain less than +1 during the reset cycle. If it is smaller than this, the previous state of the latch may not be removed. Also, the signal size upon switch 20 shutting off is actually bigger with a small switch. Hence, the best noise immunity etc. is with the smallest switch that really removed the previous state. From a speed standpoint though; one often would like a larger switch. Analysis of designs can be performed with conventional circuit simulation tools such as HSPICE ® (Avant! Corp.). Switch 20 could take on different configurations, including but not limited to most types of transistors, for example, multiple transistors, bipolar junction transistors, N-channel MOSFET, P-channel MOSFET, and CMOS transmission gates.

For example if constructed with a 1.2 micron process, transistors 14 and 16 could have a width-to-length ratio of 30 microns to 3 microns, transistors 12 and 18 could have a width-to-length ratio of 40 microns to 3 microns, transistor 20 could have a width-to-length ratio of 12 microns to 1.2 microns, and SDT resistors 30 and 32 each have a resistance of 700 ohms.

Final design parameters can be derived by iterative design, such as is known in the art.

It should be understood that SDT devices 30 and 32 can be written to prior to or even at the same time a sense pulse is initiated. Before a sense pulse ends, the write pulse should end. This allows the latch to be programmed during a sense pulse.

FIG. 5 shows one embodiment of a word line control circuit that could be used with latch 10 as shown in FIG. 2. Of course, many other designs for writing to SDT resistors 30 and 32 are possible.

It has been found that it may be necessary to protect SDT devices from voltages greater than approximately 0.5 volts. Voltages greater than this may put the SDT device at risk of improper functioning or damage. There are several ways how this could be done, such as are within the skill of those skilled in the art. One example includes via device sizing, as in the embodiment described herein, where the voltage drop across the junctions in limited to less than this amount. Another example is to add other components to limit voltage, e.g., a component or components that add a current source in series with the circuit described herein.

What is claimed:

1. A non-volatile magnetic latch cell, which comprises;
   a cross-coupled inverter pair;
   spin dependent tunneling magneto-resistive storage devices capable of having a resistive imbalance relative to one another, one spin dependent tunneling magneto-resistive storage device operatively connected to one inverter of the cross-coupled inverter pair and the other operatively connected to the other inverter for providing inputs to the inverter pair;
   a switch connected to the inputs of the inverter pair for resetting the latch cell and amplifying a resistive imbalance between the spin dependent tunneling magneto-resistive storage devices to allow sensing of the state of the magneto-resistive storage devices.

2. The apparatus of claim 1 wherein the cross-coupled inverter pair latch cell is comprised of CMOS type transistors.

3. The apparatus of claim 1 wherein the spin dependent tunneling magneto-resistive storage device is programmed to a high or low resistance state with an on-chip current generated magnetic field.

4. The apparatus of claim 3 wherein the on-chip current generated magnetic field that programs the resistance of the spin dependent tunneling magneto-resistive storage devices is performed by running current on a line adjacent to one magneto-resistive storage device in addition to running current in an opposite direction on a line adjacent to the other magneto-resistive storage device.

5. The latch cell of claim 4 wherein a line is above and/or below a magneto-resistive storage device.

6. The latch cell of claim 4 wherein the current is run perpendicular to the current in a magneto-resistive storage device.

7. The apparatus of claim 3 wherein the on-chip current generated magnetic field that programs the resistance of the spin dependent tunneling magneto-resistance storage devices is performed by using multiple current lines that together supply magnetic field sufficient to switch the magneto-resistive storage devices.

8. The apparatus of claim 1 wherein the switch can be any type of transistor including multiple transistors, bipolar junction transistors, N-channel MOSFET, P-channel MOSFET and CMOS transmission gates.

9. The apparatus of claim 1 wherein the latch cell is reset by turning on a switch with a sense pulse to force the latch cell to a known state.

10. The apparatus of claim 9 wherein the latch cell regenerates by turning off the switch and receiving inputs to the latch cell from the spin dependent tunneling magneto-resistive storage devices.

11. The apparatus of claim 10 wherein a potential imbalance is sensed from the magneto-resistive storage devices during regeneration.

12. The apparatus of claim 11 wherein the potential imbalance is amplified during regeneration and reaches a logic high or logic low at the latch cell outputs.

13. The apparatus of claim 11 wherein the amplification of the potential imbalance results in one inverter having a higher current flow than the other inverter.

14. The apparatus of claim 1 wherein the known state is an intermediate state between one and zero.

15. A method of sensing the state of a non-volatile magnetic latch cell, which comprises;
    writing differing resistance states into spin dependent tunneling magneto-resistive storage devices; and
    resetting the latch cell by turning on a switch with a sense pulse to force the latch cell to a known state.

16. The method of claim 15 wherein the latch cell regenerates by turning off the switch and receiving inputs to the latch cell from the spin dependent tunneling magneto-resistive storage devices.

17. The method of claim 16 wherein a potential imbalance is sensed from the magneto-resistive storage devices during regeneration.

18. The method of claim 17 wherein the potential imbalance is amplified during regeneration and reaches a logic high or logic low at the latch cell outputs.

19. The method of claim 17 wherein the amplification of the potential imbalance results in one inverter having a higher current flow than the other inverter.

20. The method of claim 15 wherein the known state is an intermediate state between one and zero.

21. The method of claim 15 wherein the latch cell is a cross-coupled inverter pair latch cell.

22. The method of claim 21 wherein the cross-coupled inverter pair latch cell is comprised of CMOS type transistors.

23. The method of claim 15 wherein the complimentary resistance states are programmed to a high or low resistance state with an on-chip current generated magnetic field.

24. The method of claim 23 wherein the on-chip current generated magnetic field that programs the resistance of the spin dependent tunneling magneto-resistive storage devices is performed by running current on a line adjacent to one magneto-resistive storage device in addition to running current in an opposite direction on a line adjacent to the other magneto-resistive storage device.

25. The method of claim 24 wherein a line is above and/or below a magneto-resistive storage device.

26. The method of claim 24 wherein the current is run perpendicular to the current in a magneto-resistive storage device.

27. The apparatus of claim 23 wherein the on-chip current generated magnetic field that programs the resistance of the spin dependent tunneling magneto-resistance storage devices is performed by using multiple current lines that together supply magnetic field sufficient to switch the magneto-resistive storage devices.

28. The method of claim 15 wherein the switch can be any type of transistor including multiple transistors, bipolar junction transistors, N-channel MOSFET, P-channel MOSFET, and CMOS transmission gates.

29. The method of claim 15 further comprising reading the state of the magneto-resistive storage devices.

30. The method of claim 29 wherein the step of reading comprises positive feed-back regeneration.

31. An apparatus for data sensing in a non-volatile magnetic latch cell, which comprises;
   a cross-coupled inverter pair transistor latch cell;
   spin dependent tunneling magneto-resistive storage devices, one connected to the source of one transistor in one inverter pair and the other connected to the source of one transistor in another inverter pair for providing inputs to the latch cell;
   a single transistor connected to control gates of each transistor of the latch circuit for data sensing in the latch circuit by amplifying a resistive imbalance between the magneto-resistive storage devices.

32. The apparatus of claim 31 wherein the cross-coupled inverter pair latch cell is comprised of CMOS type transistors.

33. The apparatus of claim 31 wherein the magneto-resistive storage device is programmed to a high or low resistance state with an on-chip current generated magnetic field.

34. The apparatus of claim 33 wherein the on-chip current generated magnetic field that programs the resistance of the magneto-resistive storage devices is performed by running current on a line adjacent to one spin dependent tunneling magneto-resistive storage device in addition to running current in an opposite direction on a line adjacent to the other magneto-resistive storage device.

35. The apparatus of claim 34 wherein a line is above and/or below a magneto-resistive storage device.

36. The apparatus of claim 34 wherein the current is run perpendicular to the current in a magneto-resistive storage device.

37. The apparatus of claim 33 wherein the on-chip current generated magnetic field that programs the resistance of the magneto-resistance storage devices is performed by using multiple current lines that together supply magnetic field sufficient to switch the magneto-resistive storage devices.

38. The apparatus of claim 31 wherein the single transistor can be any type of transistor including multiple transistors, bipolar junction transistors, N-channel MOSFET, P-channel MOSFET and CMOS transmission gates.

39. The apparatus of claim 31 wherein the latch cell is reset by turning on a switch with a sense pulse to force the latch cell to a known state.

40. The apparatus of claim 39 wherein the latch cell regenerates by turning off the switch and receiving inputs to the latch cell from the spin dependent tunneling magneto-resistive storage devices.

41. The apparatus of claim 40 wherein a potential imbalance is sensed from the magneto-resistive storage devices during regeneration.

42. The apparatus of claim 41 wherein the potential imbalance is amplified during regeneration and reaches a logic high or logic low at the latch cell outputs.

43. The apparatus of claim 41 wherein the amplification of the potential imbalance results in one inverter having a higher current flow than the other inverter.

44. The apparatus of claim 31 wherein the known state is an intermediate state between one and zero.

45. A non-volatile magnetic latch cell, which comprises;
   a cross-coupled inverter pair;
   spin dependent tunneling magneto-resistive storage devices capable of having a resistive imbalance relative to one another, one spin dependent tunneling magneto-resistive storage device operatively connected to one inverter of the cross-coupled inverter pair and the other operatively connected to the other inverter for providing inputs to the inverter pair;
   the spin dependent tunneling magneto-resistive storage device programmed to a high or low resistance state with an on-chip current generated magnetic field.

46. The apparatus of claim 45 wherein a switch is connected to the inputs of the inverter pair for resetting the latch cell and amplifying a resistive imbalance between the spin dependent tunneling magneto-resistive storage devices to allow sensing of the state of the magneto-resistive storage devices.

47. The apparatus of claim 45 wherein the cross-coupled inverter pair latch cell is comprised of CMOS type transistors.

48. The apparatus of claim 45 wherein the on-chip current generated magnetic field that programs the resistance of the spin dependent tunneling magneto-resistive storage devices is performed by running current on a line adjacent to one magneto-resistive storage device in addition to running current in an opposite direction on a line adjacent to the other magneto-resistive storage device.

49. The latch cell of claim 48 wherein a line is above and/or below a magneto-resistive storage device.

50. The latch cell of claim 48 wherein the current is run perpendicular to the current in a magneto-resistive storage device.

51. The apparatus of claim 45 wherein the on-chip current generated magnetic field that programs the resistance of the spin dependent tunneling magneto-resistance storage devices is performed by using multiple current lines that together supply magnetic field sufficient to switch the magneto-resistive storage devices.

52. The apparatus of claim 45 wherein the switch can be any type of transistor including multiple transistors, bipolar junction transistors, N-channel MOSFET, P-channel MOSFET and CMOS transmission gates.

53. An apparatus for data sensing in a non-volatile magnetic latch cell, which comprises;
   a cross-coupled inverter pair transistor latch cell;
   spin dependent tunneling magneto-resistive storage devices, one connected to the source of one transistor in one inverter pair and the other connected to the source of one transistor in another inverter pair for providing inputs to the latch cell;
   the magneto-resistive storage device programmed to a high or low resistance state with an on-chip current generated magnetic field.

54. The apparatus of claim 53 wherein a single transistor connected to control gates of each transistor of the latch circuit for data sensing in the latch circuit by amplifying a resistive imbalance between the magneto-resistive storage devices.

55. The apparatus of claim 53 wherein the cross-coupled inverter pair latch cell is comprised of CMOS type transistors.

56. The apparatus of claim 53 wherein the on-chip current generated magnetic field that programs the resistance of the magneto-resistive storage devices is performed by running current on a line adjacent to one spin dependent tunneling magneto-resistive storage device in addition to running current in an opposite direction on a line adjacent to the other magneto-resistive storage device.

57. The apparatus of claim 56 wherein a line is above and/or below a magneto-resistive storage device.

58. The apparatus of claim 56 wherein the current is run perpendicular to the current in a magneto-resistive storage device.

59. The apparatus of claim 53 wherein the on-chip current generated magnetic field that programs the resistance of the magneto-resistance storage devices is performed by using multiple current lines that together supply magnetic field sufficient to switch the magneto-resistive storage devices.

60. The apparatus of claim 53 wherein the single transistor can be any type of transistor including multiple transistors, bipolar junction transistors, N-channel MOSFET, P-channel MOSFET and CMOS transmission gates.

61. A non-volatile magnetic latch cell, which comprises;
a cross-coupled inverter pair;
spin dependent tunneling magneto-resistive storage devices capable of having a resistive imbalance relative to one another, one spin dependent tunneling magneto-resistive storage device operatively connected to one inverter of the cross-coupled inverter pair and the other operatively connected to the other inverter for providing inputs to the inverter pair;
a switch connected to the inverter pair for resetting the latch cell and amplifying a resistive imbalance between the spin dependent tunneling magneto-resistive storage devices to allow sensing of the state of the magneto-resistive storage devices.

62. The latch cell of claim 61 wherein the switch is connected to an inverter of the inverter pair.

63. The latch cell of claim 61 wherein the switch is connected to the inputs of the inverter pair.

64. The latch cell of claim 61 further comprising a plurality of switches connected to the inverter pair for resetting the latch cell.

65. An apparatus for data sensing in a non-volatile magnetic latch cell, which comprises;
a cross-coupled inverter pair transistor latch cell;
spin dependent tunneling magneto-resistive storage devices, one connected to the source of one transistor in one inverter pair and the other connected to the source of one transistor in another inverter pair for providing inputs to the latch cell;
a transistor connected to the latch cell for data sensing by amplifying a resistive imbalance between the magneto-resistive storage devices.

66. The apparatus of claim 65 wherein the transistor connected to the latch cell for data sensing is connected to the control gates of each transistor of the latch cell.

* * * * *